United States Patent [19]

White

[11] 4,389,538

[45] Jun. 21, 1983

[54] MULTIPLEXER FOR SINGLE-OCTAVE DATA PROCESSOR

[75] Inventor: Stanley A. White, Santa Ana, Calif.

[73] Assignee: Rockwell International Corporation, El Segundo, Calif.

[21] Appl. No.: 224,401

[22] Filed: Jan. 12, 1981

[51] Int. Cl.$^3$ .............................................. G10L 1/00
[52] U.S. Cl. ................................ 179/1 SA; 324/77 C; 364/724
[58] Field of Search ....... 179/1 SA, 15.55 R, 15.55 T; 324/77 C; 364/724, 485; 455/302, 303, 311; 358/13; 370/77, 83, 84; 375/25

[56] References Cited

U.S. PATENT DOCUMENTS

| | | | |
|---|---|---|---|
| 2,983,870 | 5/1961 | Wallace | 324/77 C |
| 3,798,560 | 3/1974 | Taylor | 358/167 |
| 3,808,412 | 5/1974 | Smith | 240/2 D |
| 3,829,670 | 8/1974 | Kebabian | 235/152 |
| 3,908,114 | 9/1975 | White | 235/152 |
| 3,930,147 | 12/1975 | Bellanger et al. | 235/156 |
| 3,959,637 | 5/1976 | Nussbaumer | 235/152 |
| 3,971,922 | 7/1976 | Bellanger et al. | 235/152 |
| 4,020,332 | 4/1977 | Crochiere | 235/152 |
| 4,093,989 | 6/1978 | Flink et al. | 364/724 |
| 4,117,541 | 9/1978 | Ali | 364/724 |
| 4,131,766 | 1/1979 | Narasimha | 179/15 FD |
| 4,164,628 | 8/1979 | Ward et al. | 179/15 BA |
| 4,237,552 | 12/1980 | Aikoh et al. | 370/83 |

OTHER PUBLICATIONS

Crochiere, et al., "Digital Coding of Speech in Sub-bands", Bell J., Oct. 1976, pp. 1065-1085.

*Theory and Application of Digital Signal Processing*, by L. R. Rabiner and B. Gold, p. 676.

"Interpolation and Decimation of Digital Signals-A Tutorial Review", *Proc. IEEE*, vol. 69, No. 3, Mar. 1981, pp. 300-331 by R. E. Crochiere and L. R. Rabiner.

Randall, R. B. and Upton, R., "Digital Filters and FET Technique Real Time Analysis", *Bruel & Kjaer Technical Review*, No. 1, 1978, pp. 3-25, Naerum (DK).

*Primary Examiner*—Emanuel S. Kemeny
*Attorney, Agent, or Firm*—H. Fredrick Hamann; Rolf M. Pitts; Randall G. Wick

[57] ABSTRACT

A multiplexer for allowing multi-octave processing of sampled data by means of a common single-octave data processor. Sampled data is preselectively delayed, corresponding to delay-coding thereof, and a multiplex switch samples the progressively delayed delay-coded data at progressively reduced data sampling rates, corresponding to lower octaves of interest. In this way the several octaves of data are interleaved or time-multiplexed. Similar multiplexing within the single-octave data processor corresponds to frequency multiplexing of the time-multiplexed multi-octave data, whereby the single bandwidth limit processor may handle such multiple-octave data.

8 Claims, 8 Drawing Figures

MULTIPLEXER FOR SINGLE-OCTAVE DATA PROCESSOR

BACKGROUND OF THE INVENTION

The concept of the invention relates to means for both frequency and time multiplexing of sampled data to enable processing of multiple octave data by a single octave data processor.

In the present state-of-the-art of signal processing, including signal pattern matching and wave-recognition, it has become feasible to introduce command and control systems responsive to spoken commands. Such commands, of course, are to be limited in number, and highly stylized in presentation in order to avoid ambiguity and to comport with the memory repertoire and other structural limitations of the command/control system. Accordingly, the word recognition device, which converts a limited sequence of preselected words into a command/control logic state must perform the recognition or classification function both reliably and with sufficient speed as to be useful or adequate in a given tactical situation or field of application.

Further considerations in the practical application of such technology are the cost and complexity of the mechanization involved to realize such word recognition and classification. A significant aspect of such word recognition and classification function is the spectral analysis of a voice pattern, presenting a spoken command or imperative message, from which spectral analysis the key words of a given element of a command/control repertoire can be extracted. Such spectral analysis may be performed by a fast fourier transform (FFT) analyzer, similar to that described in my co-pending U.S. application Ser. No. 092,387, filed Nov. 8, 1979 for SIMPLIFIED FFT BUTTERFLY ARITHMETIC UNIT. The size of the FFT unit required is ordinarily determined by the bandwidth or number of octaves of interest and the resolution or number of spectral lines required to be obtained. Although my above-noted co-pending application describes an efficient machine for effecting such spectral analysis, a more efficient, smaller bandwidth device is to be preferred without, however, sacrificing data processing bandwidth or data resolution.

SUMMARY OF THE INVENTION

By means of the concept of the invention, there is provided efficient multiplexing means for allowing multi-octave processing by means of a common single octave sampled data processor, as to avoid the requirements of a plethora of data processing structure for a bandwidth covering a plurality of octaves. In a preferred embodiment of the invention there is provided means for progressively delaying sampled data, corresponding to delay-coding thereof and time-multiplex means for sampling the progressively delayed delay-coded data at progressively reduced data sampling rates, corresponding to lower octaves of interest, for cooperation with a single octave processor. Output multiplex means, responsive to the single octave processor and operated in unison with the multiplex sampling means, sorts out the sampled output of the single octave processor by octaves of interest.

In normal operation of the above-described arrangement, successively lower octaves of sampled data are decimated or sampled at successively reduced sampling rates and delay-coded, whereby the data samples for all octaves of interest are interleaved in time. Each delay-coded decimated data set is processed by the data processor (i.e., FFT analyzer or other kind of processor) at a like-decimated data rate, corresponding to a frequency translation to the bandwidth or octave of the common single octave processor employed. By means of this arrangement, a selected bandwidth, corresponding to any number of octaves of interest, may be processed by means of a single common processor of only one octave, with a consequent economy in the mechanization so employed.

Accordingly, it is an object of the invention to provide more efficient means of processing sampled data corresponding to two or more octaves in bandwidth.

Another object is to provide multiplexing for allowing multi-octave processing by means of a single-octave data processor.

These and other objects of the invention will become apparent from the following description, taken together with the accompanying drawings, in which:

DETAILED DESCRIPTION OF THE INVENTION

Figure 1:
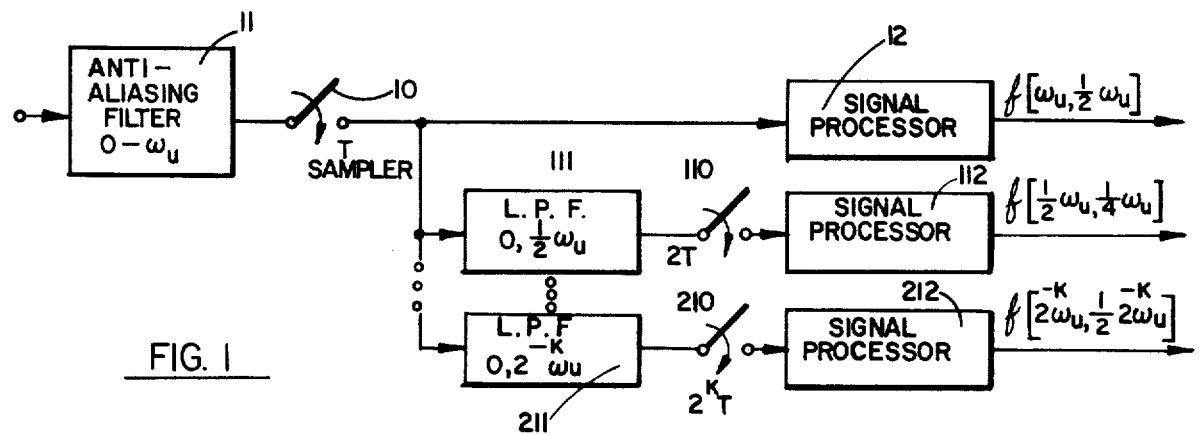
FIGS. 1, 2 and 3 are alternate embodiments of a multi-octave data processor, employing a plurality of single-octave processors.

Referring now to FIG. 1, there is illustrated a system for multi-octave signal processing by means of a plurality of single octave signal processors, and representing a type of system sought to be supplanted by the device of the invention. There is provided a data sampler 10 having a sampling periodicity T, corresponding to a sampling rate or frequency of $1/T$, which frequency is at least twice as high as the data spectral limit or upper frequency of interest, $\omega_u$. An anti-aliasing, low-pass filter 11 having a cut-off frequency $\omega_u < (\pi/T)$ is included in the tandem with data sampler 10 in order to avoid the effects of the sampling frequency, in accordance with the well-known Nyquist criterion. A bandwidth-limited signal processor 12 is coupled to sampler 11 for processing a limited bandwidth portion ($\frac{1}{2}\omega_u$ to $\omega_u$) of the sampled data, such portion corresponding to a highest or upper octave of interest.

Successive lower octaves of the sampled data may be processed concomitantly by a succession of single-octave processors, as indicated in FIG. 1. For example, by the parallel addition of successive data processors, each designed for a successively lower octave, a desired octave range of data processing may be covered. However, such an approach does not permit the engineering economy of a single common design for such plurality of processors. A preferable arrangement for FIG. 1 would include a single common design for such plurality of processors. A preferrable arrangement for FIG. 1 would include a single common design for the single-octave processors. For example, by similarly slowing down both the clock rate of the processor and the data sample rate, the same single octave processor design, used for the upper octave ($\frac{1}{2}\omega_u - \omega_u$) processor 12, may be used for the next lower octave ($\frac{1}{4}\omega_u - \frac{1}{2}\omega_u$). Thus, a halved clock rate for processor 112 serves to frequency-translate that octave in which single octave processor 112 operates. In other words, for a given discrete-time data-processor design, the product of processed data spectral sample $\omega$ and sampling periodicity, T represents a constant $\omega T = K$: as the periodicity of the sampling rate and processor clock rate, T, increases (corresponding to a reduced clock rate), the spectral line $\omega$ thus processd for the sampled data represents one inversely translated and reduced relative to that processed by the higher clock rate. A further non-aliasing filter 111 with a correspondingly reduced corner frequency ($\omega_c = \frac{1}{2}\omega_u$) is also required.

Successive lower octaves may be processed by like processors 212 as elements 12 and 112 and by the use of successively longer sampling and clocking periodicities ($2^K T$) and anti-aliasing filters 211 of correspondingly lower corner-frequencies ($2^{-K}\omega_u$). The matter of varying the bandwidth response of a digital filter or other digital data processor by varying the feedback clock rate thereof, for example, has been discussed in U.S. Pat. No. 3,639,739 issued to R. M. Golden and S. A. White for DIGITAL LOW PASS FILTER.

Figure 2:
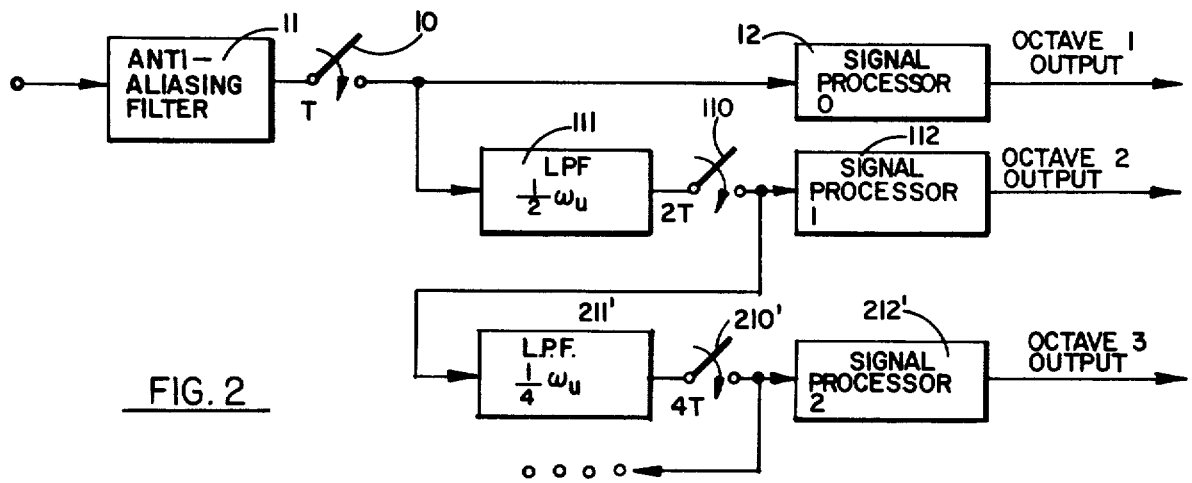
Figure 3:
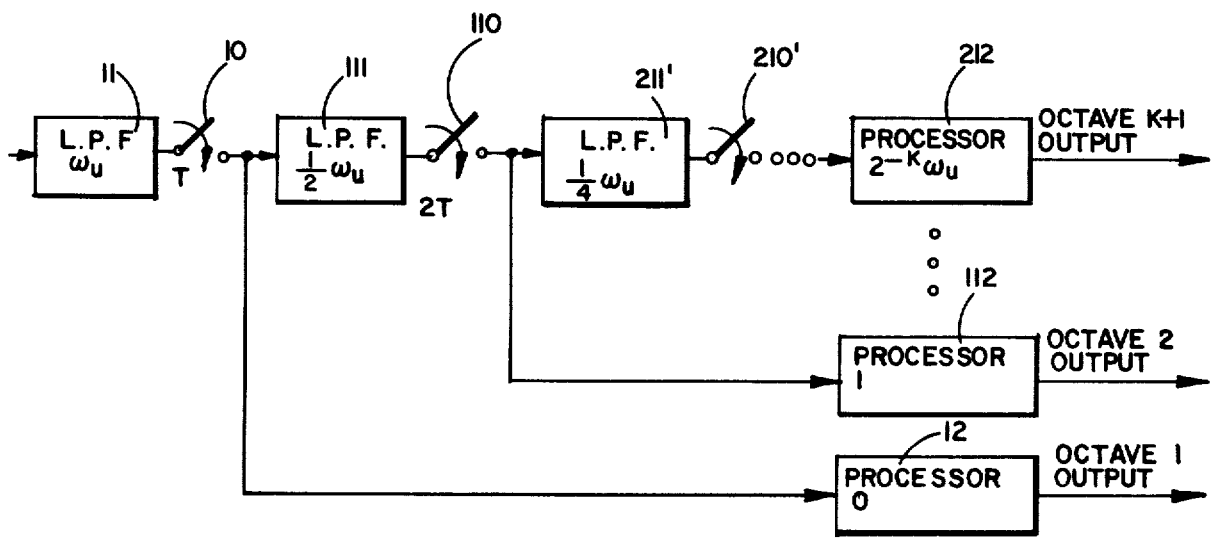

An alternate mechanization of the multi-octave processing of sampled data by means of a plurality of single-octave processors is shown in each of FIGS. 2 and 3, which differ from the arrangement of FIG. 1 in that a successive tandem set of filter, sampler and processor is connected to the output of the sampler of a preceding set. For example, while the second tandem set of filter 111, sampler 110, and processor 112 for the octave next below the first and highest octave (processed by first set 10, 11 and 12) is connected to the output of first sampler 10, a third set 210', 211' and 212' is connected to the output of second sampler 110.

It is to be noted that within the text of the subject disclosure of multiple octave processing, the highest octave of interest is referred to herein as a first octave (i.e., in FIG. 1, $\frac{1}{2}\omega_u - \omega_u$); the next lower octave ($\frac{1}{4}\omega_u - \frac{1}{2}\omega_u$) is referred to as Octave 2, and a lowest octave as Octave K+1, the upper frequency of which corresponds to $2^{-K}$ times the upper frequency $\omega_u$ of the highest or first octave.

Figure 4:
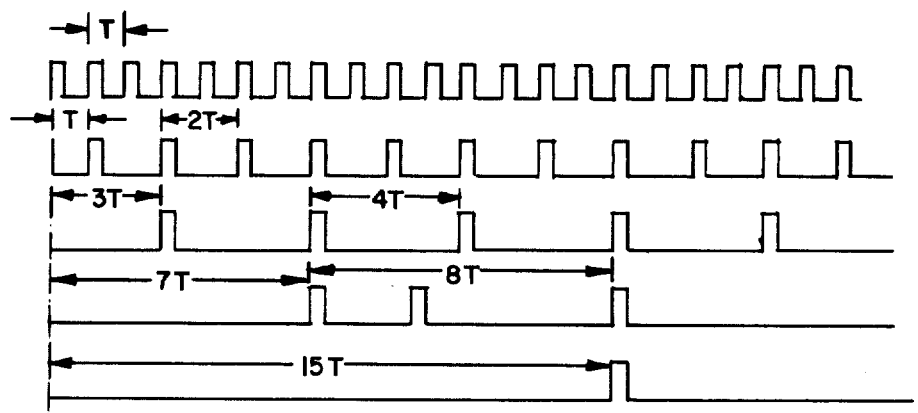
FIG. 4 is a family of time-histories, illustrating the response of the samplers in FIG. 3.

A set of representative time histories produced by the samplers (of FIGS. 1, 2 and 3) for successive octave sets is shown in FIG. 4, the samples of Octave 1 corresponding to the response of first sampler 10 in FIG. 3 and demonstrating the periodicity T; the samples for Octave 2 corresponding to second sampler 110 in FIG. 3 and demonstrating the periodicity 2T; Octave 3 samples corresponding to third sampler 210' and demonstrate the periodicity 4T. The samples for Octaves 4 and 5 are also shown, demonstrating a periodicity of 8T and 16T, respectively. It is also to be observed that a timephase delay is incurred in the sampled pulse train for successive (lower) octaves, relative to Octave 1, the delays for Octaves 2, 3, 4 and 5 being T, 3T, 7T and 15T, respectively.

Figure 5:
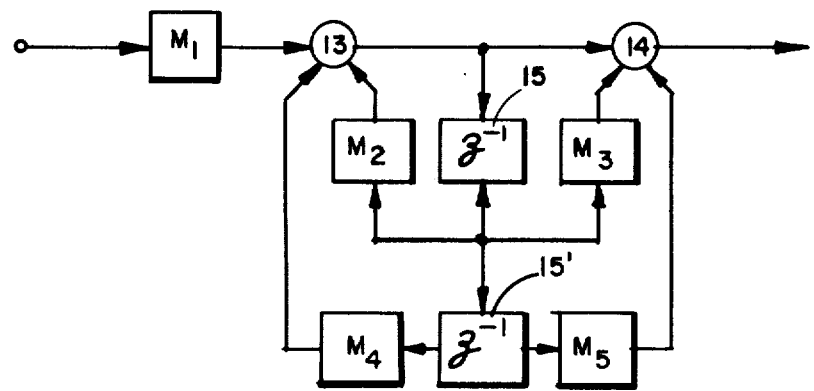
FIG. 5 is a block diagram of am exemplary prior-art low-pass filter.

Although the arrangement of FIGS. 1, 2 and 3, as described above, discloses means of employing a common design for the discrete time data processors 12, 112 and 212, still a plurality of such devices are yet required in such arrangement for the processing of a like number of octaves of the sampled data, in addition to a like number of data samplers and anti-aliasing filters. One of the expensive elements in digital processor including, for example, a digital filter, is the digital multiplier employed as gain-scaling elements in the filter mechanization, as shown in FIG. 5. Referring to FIG. 5, there is shown, in block form, an exemplary mechanization of a second order digital filter, of a sort quite common in the prior art and which may be employed, for example, as the non-aliasing devices of FIG. 1. Such device is seen from FIG. 5 to comprise two digital combiners 13 and 14, two one-word delay elements 15 and 15', and five gain-scaling multipliers, $M_1 - M_5$.

By means of the concept of the invention, the delays illustrated between the sampled data sets for different octaves in FIG. 4 are to be employed in a delay-coded, time multiplexing frequency-multiplexing technique, whereby only one common single-octave processor and one additional anti-aliasing filter are required to process a multi-octave range of sampled data. A mechanization for implementing such scheme is conceptually shown in FIG. 6.

Figure 6:
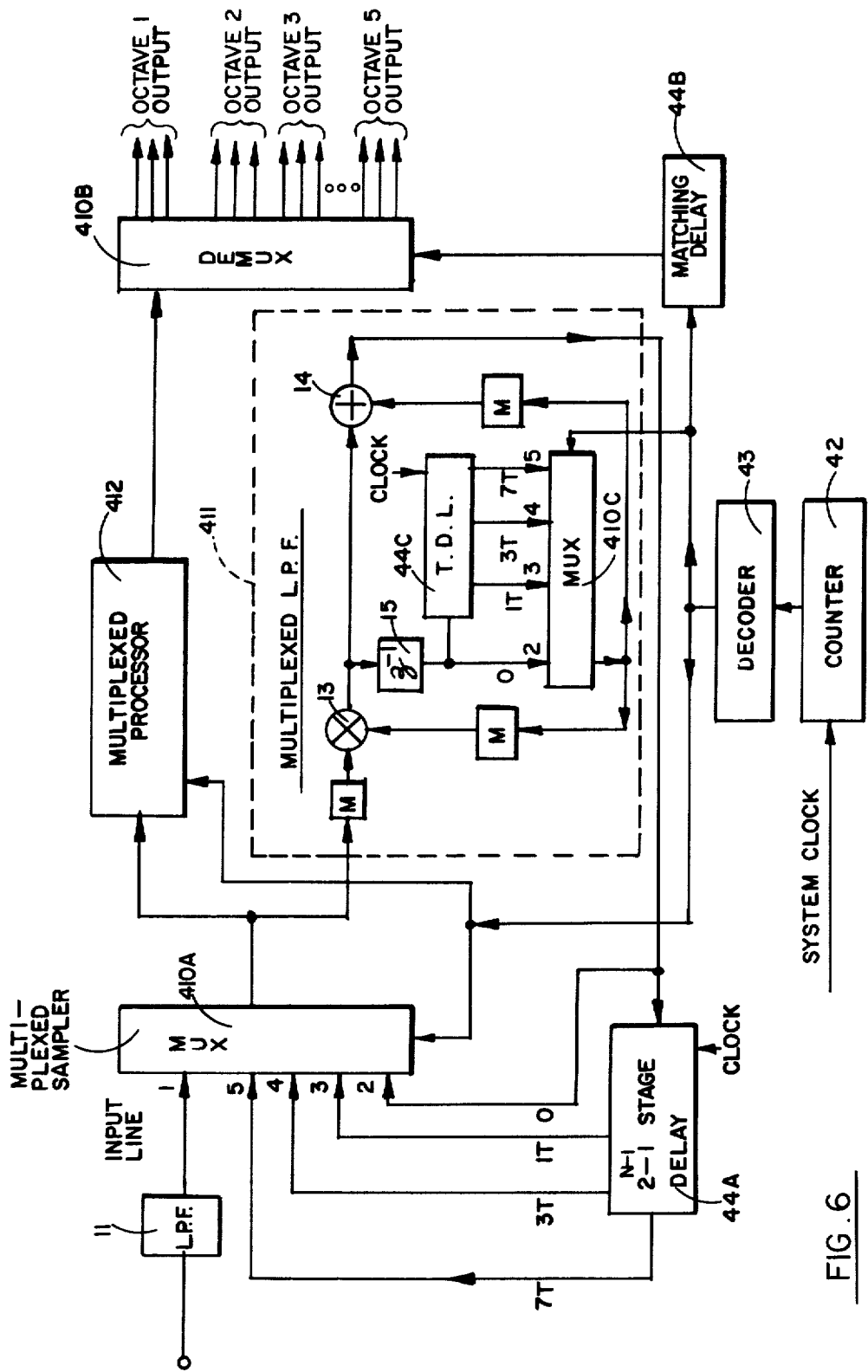
FIG. 6 is a block diagram of a system embodying the concept of the invention.

Referring now to FIG. 6, there is illustrated a digital data processing system embodying the concept of the invention, in which the separate data sample rates for successively lower octaves (in FIG. 4) are delay-coded and interleaved as to provide time-multiplexing in a single processor, while also effecting successive octave reductions in the interval processor clock rate by which successive data sample rates are processed, in the manner of frequency multiplexing the lower octave data up to within the bandwidth of the bandwidth-limited (i.e., single-octave) processor. Such multi-octave processing system is comprised of an input time-multiplexer 410A in cooperation with a multiple stage delay 44A and low-pass feedback filter 411. Although a simple first-order filter is shown as filter 411, by no means are we restricted to such a filter. Such three units cooperate to successively decimate the data by successively lower octaves on successive passes of the data pulse train through filter 411. Such filter 411 serves as an anti-aliasing filter at a successively lower corner cutoff frequency ($2^{-K}\omega_u$) for successive passes of the (decimated) data through the filter 411, each pass K corresponding to a successive ($N = K + 1$) octave of interest.

Time-delay coding of successive feedback passes of the sampled data is accomplished by the cooperation of the tapped delay line or clocked register 44A and the preselected sequence of operation of multiplex switch (MUX) 410A, under the control of a decoder 43, in response to a clocked counter 42. The preselected operational sequence of MUX 410A also effects the sampling and necessary decimation of the delay-coded data, corresponding to the function of the successive samplers 10, 110 and 210' of FIG. 3, as shown in FIG. 7.

Figure 7:
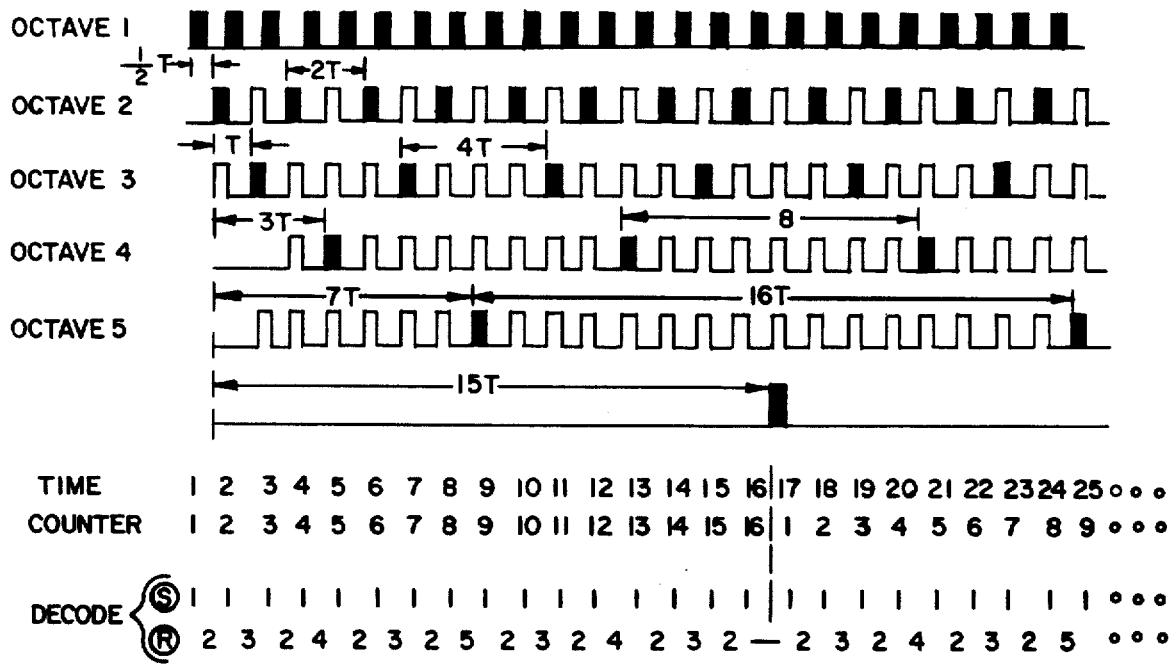
FIG. 7 is a family of time histories of the responses of several elements of the system of FIG. 6.

Referring now to FIG. 7, there is illustrated a family of time histories of the responses of various elements of the multiplexing arrangement in FIG. 6. The time history labeled Octave 1 describes the sampling of the input line by MUX 410A at a periodicity of T. The trace labeled Octave 2 describes the input applied to line 2 of MUX 410A and to clocked delay register 44A. Such Octave 2 trace is seen to resemble the Octave 1 trace, merely having been delayed, say $\frac{1}{2}T$ in progressing from the (Octave 1) input line 1 through MUX 410A and filter 411 to line 2 of MUX 410A. In other words, MUX 410A is controlled by decoder 43 to turn-on line 1 during a first-half or portion of the period T and to turn-on line 2 only during the later portion or second-half thereof for alternate periods of the periodicity T, such turned-on or switched pulses of the decimated pulse train being shown in solid block in FIG. 7. In this way, the ½T-delayed Octave 2 pulse-train of periodicity T is decimated to a pulse train of 2T periodicity and interleaved with the Octave 1 T periodicity pulse train prior to progressing through multiplexed processor 412.

The applied pulse train of periodicity T (as shown for Octave 1 in FIG. 7), as delayed ½T through filter 411 (as shown for Octave 2 in FIG. 7), progresses through delay register 44A, which has taps or preselectively delayed outputs, each representing a preselected and progressive multiple of the period, T, the first tap providing the delay T, the second tap 3T and the fourth tap, the delay, 7T, the outputs of which taps are fed to corresponding inputs to MUX 410A (in FIG. 6): A 0 (zero) delay corresponding to input line 2 of MUX 410A, and 1T, 3T and 7T delays corresponding to input lines 3, 4 and 5, respectively, of MUX 410A.

The delayed pulse train occurring at the first output tap (1T) of delay register 44A in FIG. 6 (corresponding to the trace labeled Octave 3 in FIG. 7) is sampled by MUX 410A (under the control of decoder 43) at every fourth pulse, beginning with the delayed first pulse, such sampled pulses of the Octave 3 pulse train being shown in solid black in FIG. 7. In other words, MUX 410A is controlled by decoder 43 to turn-on line 3 (in FIG. 6) during the occurrence of an alternate one of the non-sampled Octave 2 pulses for line 2. In this way, the delayed pulse train is further decimated to an Octave 3 pulse train of 4T periodicity and interleaved with the T-periodicity and 2T-periodicity pulse trains. Such Octave 3 pulse sampling time is also seen (from FIG. 7) to correspond to a concomitant non-sample time for both the Octave 1 and Octave 2 pulse trains.

The progression of the applied pulse train through delay register 44A to the second output tap (3T) in FIG. 6 (corresponding to the trace labeled Octave 4 in FIG. 7) is sampled by MUX 410A at every eighth pulse, beginning with the delayed first pulse, such sampled pulses of the Octave 4 pulse train being shown in solid block in FIG. 7. In other words, MUX 410A is controlled by decoder 43 to turn-on line 4 (in FIG. 6) during the concomitant occurrence of a non-sampled pulse time for all of the earlier pulse trains (i.e., Octaves 1, 2 and 3). In this way, the delayed pulse train is further decimated to an Octave 4 pulse train of 8T periodicity and interleaved with the T-periodicity Octave 1, 2T-periodicity Octave 2, and 4T-periodicity Octave 3 pulse trains.

The continued progression of the applied pulse train through delay register 44A to the third output tap (7T) in FIG. 6 (corresponding to the trace labeled Octave 5 in FIG. 7) is sampled by MUX 410A at every sixteenth pulse, beginning with the delayed first pulse, such sampled pulses of the Octave 5 pulse train being shown in solid black in FIG. 7. Thus, MUX 410A turns on or switches line 5 (in FIG. 6) during the concomitant occurrence of a non-sampled pulse time for all of the earlier pulse-trains (i.e., Octaves 1, 2, 3 and 4). In this way the delayed pulse train is further decimated to an Octave 5 pulse train of 16T periodicity and interleaved with the T-periodicity Octave 1, 2T-periodicity Octave 2, 4T-periodicity Octave 3, and 8T-periodicity Octave 4 pulse trains.

From the description above it is clear that the halved sampling rate of a delay-coded successive octave occurs during the concomitant occurrence of a decimated or non-sampled pulse of the previous octave pulse trains.

The logic of decoder 43 may also be appreciated from further inspection of FIG. 7. For the exemplary five octaves of interest in FIG. 7, the response of counter 42 (of FIG. 6) is illustrated as having a periodicity of 16T in FIG. 7. Also, the response of MUX 410 of FIG. 6 is illustrated in FIG. 7 as having a set Ⓢ and reset Ⓡ modes within each period T. During the set mode (in FIG. 7) MUX 410A samples line 1 (of FIG. 6), and during the reset or Ⓡ modes, a preselected one of lines 2–5 (of FIG. 6) are sampled, the sampling sequence for lines 2–5 being indicated by the numerical sequence for the Decode Reset Ⓡ trace in FIG. 7. Such sequence is arrived at by noting, for the second half of each time period T, that Octave in FIG. 7, for which a sampled or solid black pulse is illustrated. For example, in the second half of time, $t=1$ in FIG. 7, a solid black pulse occurs in the Octave 2 trace, resulting in the code 2 being identified at that point in time for the Decode reset Ⓡ; in the second half of time, $t=2$, a solid black pulse is illustrated in the Octave 3 trace, resulting in the code 3 at that point in time for the Decode reset Ⓡ; for $t=3$, the reset code is 2, and for $t=4$, the reset code is 4. The MUX reset code (i.e., Decode Ⓡ is illustrated in FIG. 7 for a cyclical time up to $t=16$ for which none of codes 2–5 is represented, such periodic time slot being reserved for sequential use for other octaves than the five exemplary ones illustrated.

Hence, it is to be appreciated that MUX 410A, decoder 43, and delay register 44A cooperate in the arrangement of FIG. 6 to provide successive decimation of successively delay-coded sampled data, corresponding to successively lower octaves, while also providing the interleaving or time-multiplexing of such multi-octave data.

By employing similar multiplexing in each of processor 412 and anti-aliasing filter 411, multi-octave processing may be achieved by only one single-octave processor and a single additional anti-aliasing filter.

Figure 8:
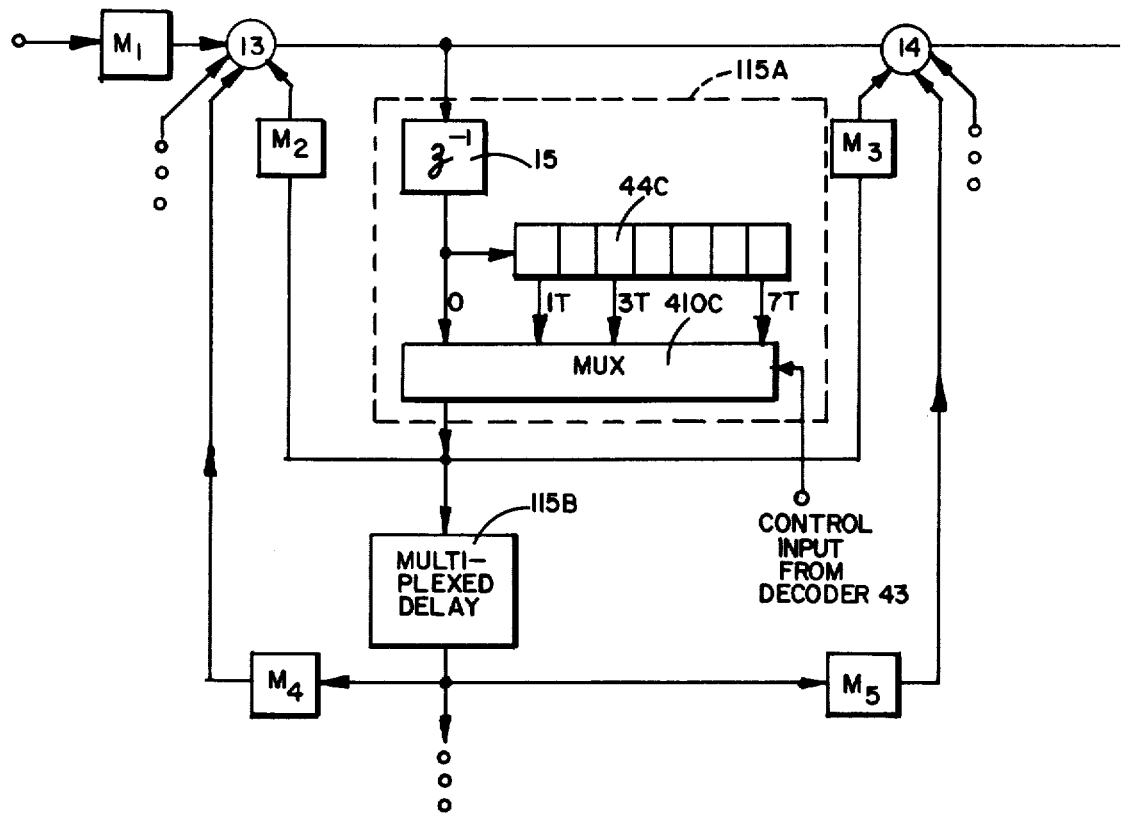
FIG. 8 is a block diagram of an exemplary embodiment of the multiplexed low pass filter utilized in FIG. 6, In the figures, like reference characters refer to like parts.

Such multiplexing arrangement in each of multiplexed (single-octave) processor 412 and multiplexed low-pass filter 411 in FIG. 6, involves the substitution of the multiplexed delay arrangement in FIG. 8 for each $z^{-1}$ delay element in such digital processor devices. For example, the substitution of multiplexed delay elements 115A and 115B (each corresponding to the arrangement in FIG. 8) for each of one-word delay elements 15 and 15' in the exemplar anti-aliasing low-pass filter of FIG. 5, would result in the arrangement in FIG. 8.

Such substitute multiplexed delay element in the arrangement of FIG. 8 serves to decimate and phase-code the data, whereby the input data for a given octave is processed at combiners 13 and 14 with the (delayed and like-decimated) previous sample for such octave. In other words, the multiplexed filter 411 in FIGS. 6 and 8 is operated at a lower (decimated) clock rate for a lower-frequency octave and at a higher clock rate for a higher-frequency octave ($\omega T = K$), whereby a single filter of limited bandwidth may handle each octave equally well, and where, further, the data for such plurality of octaves is interleaved or time-multiplexed.

It is to be noted from FIG. 8 and understood, however, that the multiplexer switch or MUX element 410C employed in the multiplexed filter 411 of FIG. 6 does not perform the two-state "set", "reset" functions (Ⓢ and Ⓡ, respectively) shown in FIG. 7. Instead, such element performs only the decimation and interleaving switching sequence described for the "reset" function Ⓡ in FIG. 7, and thus filters only Octaves 2, 3, 4, 5 (etc.), but does not output or process or filter Octave 1. Such structural difference is noted by the absence of an input line 1 for MUX 44C (in FIG. 8). Thus, a separate anti-aliasing low pass filter 11 is retained in the line 1 input to input MUX 410A in FIG. 6.

Multiplexed processor 412 (in FIG. 6) responds to the applied input data train from MUX 410 representing the interleaved octave data samples for several successive octaves, to provide an output of interleaved processed data samples for the interleaved successive octaves. Such interleaved data is then separated into data sets by octave number by means of output DEMUX 410B, the arrangement of which is conceptually identical to that of output-MUX 410A. In other words, DEMUX 410B employs the like control input from decoder 43 to preselectively couple the applied input of DEMUX 410B to an appropriate output terminal, corresponding to a given octave, whereby the interleaved data for each octave is sorted out. A delay element 44B may be interposed between decoder 43 and the control input of DEMUX 410B in order to match the processing delay through processor 412 and to more carefully synchronize the operation of MUX 410B with the delayed output of processor 412, as is well understood in the art of sample data processing.

Because processor 412 is intended to process the octave 1 data, as well as the (interleaved) decimated data of the successive lower octaves of interest, the MUX elements employed in multiplexed processor 412 are similar to element 410 in providing both the "set"/"reset" functions, Ⓢ and Ⓡ of FIG. 7, as well as providing the decimation sequence of the reset Ⓡ mode of FIG. 7.

Accordingly, there has been described a system for the time-and-frequency multiplexing of five successive octaves of data by means of a multiplexed feedback anti-aliasing filter in cooperating with a preselectively sequentially time-phase coded input multiplex switch. Such operation is in accordance with the sequence and delay codes listed in Tables 1A and 1B:

TABLE 1A

| No. of Octaves to be Processed | Delay Code |
|---|---|
| 2 | $0 = 2^0 - 1$ |
| 3 | $1 = 2^1 - 1$ |
| 4 | $3 = 2^2 - 1$ |
| 5 | $7 = 2^3 - 1$ |

TABLE 1B

| No. of Octaves to be Processed | Sequence of Octaves to be Processed |
|---|---|
| 1 | 1 |
| 2 | 1 2 1 |
| 3 | 1 2 1 3 1 2 1 |
| 4 | 1 2 1 3 1 2 1 4 1 2 1 3 1 2 1 |
| 5 | 1 2 1 3 1 2 1 4 1 2 1 3 1 2 1 5 1 2 1 3 1 2 1 4 1 2 1 3 1 2 1 |

The concept of the invention is not limited to the processing of only five (5) successive octaves. Instead, the delay-code can be shown to be constructed for a given plurality of octaves as follows. In general, the delay code, $DT = \tau$ (for sample period, T) is related to the octave number N, by the relationship:

$$D = 2^{N-2} - 1.$$

The sampling sequence for any given number of octaves to be processed may be deduced from Table 1 by noting that:
1. The central number is equal to the number of octaves being processed (i.e., increased arithmetically in the vertical array)
2. The number 1 occurs alternatively in each horizontal array
3. Each number occurs (is repeated in) vertical array
4. More importantly, the line or horizontal array or sequence, S(N) (for a given number, N, of octave being processed) is represented by three parts and comprised of: the prior line or sequence S(N−1), the octave number (N), and a repeat of the prior line or sequence S(N−1), where S(1)=1.

Accordingly, there has been described improved digital processing means for the spectral processing of sampled data representing a multiple octave bandwidth, such improvement comprising time-delay coding and preselective decimation of the sampled data for interleaving and frequency multiplexing data sampler for different octaves.

Although the invention has been described and illustrated in detail, it is to be clearly understood that the same is by way of example only, and not by way of limitation, the spirit and scope of the invention being limited only by the terms of the appended claims.

I claim:
1. Multiplexing means for allowing multi-octave processing of sampled data by means of a single octave data processor and comprising:
    means for progressively delaying said sampled data, corresponding to delay coding thereof so that delay-coded data is produced by said means for delaying; and
    multiplex means for producing multiplexed sampled data by progressively sampling said delay-coded data from said means for delaying at progressively reduced data sampling rates, corresponding to lower octaves of interest, so that said multiplexed sampled data includes interleaved samples corresponding to a plurality of octaves for processing by said single octave data processor.
2. The device of claim 1 in which there is further provided output demultiplex means responsive to said single octave processor and operated in unison with said multiplex sampling means for sorting out the sampled output of said single octave processor by octaves of interest.
3. Multiplexing means for allowing multi-octave processing of sampled data by means of a single octave data processor and comprising:
    means for progressively delaying said sampled data, corresponding to delay coding thereof so that delay-coded data is produced by said means for delaying; and
    multiplex means for producing multiplexed sampled data by progressively sampling said delay-coded data from said means for delaying at progressively reduced data sampling rates, corresponding to lower octaves of interest, so that said multiplexed sampled data includes interleaved samples corre- sponding to a plurality of octaves for processing by said single octave data processor, wherein said multiplexing means allows five-octave processing by means of the common single-octave processor, and in which:

said sampled input data is applied to a multiplex input line 1;

said means for progressively delaying provides delay-coding of 0, 1, 3, and 7 word times, respectively, corresponding to multiplex input lines 2, 3, 4 and 5, respectively; and said multiplex means for sampling samples said data input lines in the following sequence, 1, 2, 1, 3, 1, 2, 4, 1, 2, 1, 3, 2, 1, 5, 1, 2, 1, 3, 1, 2, 1, 4, 1, 2, 1, 3, 1, 2, 1.

4. Multiplexing means for allowing multi-octave processing of sampled data by means of a single octave data processor and comprising:

means for progressively delaying said sampled data, corresponding to delay coding thereof so that delay-coded data is produced by said means for delaying; and multiplex means for producing multiplexed sampled data by progressively sampling said delay-coded data from said means for delaying at progressively reduced data sampling rates, corresponding to lower octaves of interest, so that said multiplexed sampled data includes interleaved samples corresponding to a plurality of octaves for processing by said single octave data processor, wherein said multiplexing means allows five-octave processing by means of the common single-octave processor, and in which:

said sampled input data is applied to a multiplex input line 1;

said means for progressively delaying provides delay-coding of 0, 1, 3 and 7 sample times (T), respectively; corresponding to multiplex input lines 2, 3, 4 and 5, respectively; and said multiplex means for sampling performs sampling of said multiplex input line 1 during a first portion of each sample-time, and samples one of multiplex input lines 2-5 during a second portion of each sample time (T) in accordance with the following sequence: 2, 3, 2, 4, 2, 3, 2, 5, 2, 3, 2, 4, 2, 3, 2.

5. The device of claim 1 in which said multiplexing means allows N-octave processing by means of the common single-octave processor, and in which:

said sampled input data is applied to a multiplex input line 1;

said means for progressively delaying provides delay-coding $DT = \tau$ (for sample time, T) in accordance with the relationship, $D = 2^{N-2} - 1$, where N is an integer number; and said multiplex means for sampling samples said input data line 1 during a first portion of each sample time, T, and samples of one of said progressively delay-coded samples during a second portion of said sample time in accordance with the following set of sequences: S(N−1), S(N), S(N−1), where S(1)=1.

6. Multiplexed single octave means for processing multi-octave data, comprising:

two-pole sampling means for sampling input data and feedback data, alternatively, each at a preselected sampling periodicity;

a single-octave discrete time data processor;

a discrete-time, anti-aliasing low pass filter, an input of each of said processor and filter being commonly connected to an output of said sampling means;

feedback multiplex delay means interposed between an output of said filter and a feedback input of said sampling means for providing interleaved output sample sequences represented by successively delay-coded and decimated sampled data, a successive delayed sequence having a progressively doubled sampling periodicity corresponding to a progressively lower octave;

each of said filter and said processor including like multiplex delay means as said feedback multiplex delay means for providing interleaved output sample sequences representing progressively delay-coded and decimated sampling rates, a successive delayed sequence having a progressively doubled sampling periodicity corresponding to a progressively lower octave, all said multiplex delay means operated in unison; and multiplex output means responsively coupled to an output of said processor for sorting out the outputs of said processor by preselectively delay-coded and decimated sequences of output samples on a sequence of output line sets, each set corresponding to a mutually exclusive octave of interest.

7. The device of claim 6 in which each of said multiplex delay means comprises:

a clocked shift register for providing a plurality of progressively delays to an applied input;

a multiplexed switch for sampling said applied input and said delayed input in a preselected sequence, as to achieve a plurality of data sequence, each of a progressively-doubled sampling periodicity, each successive periodicity being preselectively delay-coded; and a logic decoder responsive to a clocked counter for controlling said preselected sampling sequence of said multiplexed switch.

8. The device of claim 7 in which said multiplexed switch means includes said two-pole sampling means.

* * * * *